US012804986B2

(12) United States Patent
Hayasaka

(10) Patent No.: US 12,804,986 B2
(45) Date of Patent: Nov. 17, 2026

(54) SEMICONDUCTOR DEVICE WITH THROUGH HOLE PENETRATING STACK OF DIAMOND LAYER, BASE AND SEMICONDUCTOR LAYER AND PROTRUSION OF THE BASE PROTRUDING INTO THE DIAMOND LAYER, AND SECOND METAL LAYER COVERING INNER SIDE OF THE THROUGH HOLE AND MAKING ELECTRICAL CONTACT WITH FIRST METAL LAYER ON THE SEMICONDUCTOR LAYER, AND METHOD FOR MANUFACTURING SEMICONDUCTOR DEVICE

(71) Applicant: SUMITOMO ELECTRIC INDUSTRIES, LTD., Osaka (JP)

(72) Inventor: Akihiro Hayasaka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 392 days.

(21) Appl. No.: 18/647,303

(22) Filed: Apr. 26, 2024

(65) Prior Publication Data

US 2024/0379784 A1 Nov. 14, 2024

(30) Foreign Application Priority Data

May 11, 2023 (JP) ................................ 2023-078807

(51) Int. Cl.
*H10D 64/23* (2025.01)
*H10D 30/01* (2025.01)
(Continued)

(52) U.S. Cl.
CPC ......... *H10D 64/256* (2025.01); *H10D 30/015* (2025.01); *H10D 30/47* (2025.01); *H10W 40/254* (2026.01); *H10D 62/8503* (2025.01)

(58) Field of Classification Search
CPC .... H10D 64/256; H10D 30/015; H10D 30/47; H10D 62/8503; H10W 40/254
(Continued)

(56) References Cited

U.S. PATENT DOCUMENTS 6,426,511 B1 * 7/2002 Nakagawa .............. H03B 7/14 257/605
11,626,323 B2 * 4/2023 Kosaka ............. H10D 62/8503 438/634
(Continued)

FOREIGN PATENT DOCUMENTS

WO 2020/255259 12/2020

*Primary Examiner* — Jami Valentine Miller
(74) *Attorney, Agent, or Firm* — IPUSA, PLLC

(57) ABSTRACT

A semiconductor device includes a substrate having a base provided with a first surface and a second surface opposite to the first surface, and a protrusion protruding from the base in a direction opposite to the first surface, a semiconductor layer in contact with the first surface, a first metal layer provided on the semiconductor layer in contact with the semiconductor layer, and overlapping the protrusion in a plan view perpendicular to the first surface, a diamond layer having a third surface in contact with the second surface, and a fourth surface opposite to the third surface, and a second metal layer covering an inner side of a through hole and the fourth surface and electrically connected to the first metal layer. The through hole penetrates the protrusion, the base, and the semiconductor layer and reaches the first metal layer.

9 Claims, 14 Drawing Sheets

(51) Int. Cl.

| | |
|---|---|
| ***H10D 30/47*** | (2025.01) |
| ***H10W 40/25*** | (2026.01) |
| *H10D 62/85* | (2025.01) |

(58) Field of Classification Search
USPC ........................................................... 257/77
See application file for complete search history.

(56) References Cited

U.S. PATENT DOCUMENTS

| | | | | |
|---|---|---|---|---|
| 11,637,068 | B2 * | 4/2023 | Stamper | H10W 20/023<br>257/506 |
| 2021/0098296 | A1 * | 4/2021 | Dumka | H10D 62/115 |
| 2021/0166970 | A1 * | 6/2021 | Kosaka | H10D 62/8503 |
| 2021/0249258 | A1 * | 8/2021 | Lee | H10D 30/015 |
| 2022/0148941 | A1 * | 5/2022 | Yoshitsugu | H10D 30/015 |
| 2022/0154727 | A1 * | 5/2022 | Takaada | F16J 15/106 |
| 2023/0154825 | A1 * | 5/2023 | Tong | H10W 40/254<br>257/659 |
| 2024/0379784 | A1 * | 11/2024 | Hayasaka | H10D 30/015 |
| 2025/0006799 | A1 * | 1/2025 | Kawamura | H10D 62/405 |

* cited by examiner

SEMICONDUCTOR DEVICE WITH THROUGH HOLE PENETRATING STACK OF DIAMOND LAYER, BASE AND SEMICONDUCTOR LAYER AND PROTRUSION OF THE BASE PROTRUDING INTO THE DIAMOND LAYER, AND SECOND METAL LAYER COVERING INNER SIDE OF THE THROUGH HOLE AND MAKING ELECTRICAL CONTACT WITH FIRST METAL LAYER ON THE SEMICONDUCTOR LAYER, AND METHOD FOR MANUFACTURING SEMICONDUCTOR DEVICE

CROSS-REFERENCE TO RELATED APPLICATIONS

This application is based upon and claims priority to Japanese Patent Application No. 2023-078807, filed on May 11, 2023, the entire contents of which are incorporated herein by reference.

TECHNICAL FIELD

The present disclosure relates to semiconductor devices, and methods for manufacturing semiconductor devices.

BACKGROUND

In semiconductor devices, such as gallium nitride (GaN) high electron mobility transistors (HEMTs) or the like, a large amount of heat is generated due to improved operating speeds. Accordingly, a proposed semiconductor device includes the HEMT provided on a diamond substrate, in order to improve heat dissipation. An example of the conventional semiconductor device is proposed in International Publication Pamphlet No. WO 2020/255259, for example.

In the conventional semiconductor device using the diamond substrate, it is impossible to form micro through holes in the diamond substrate. Thus, it is difficult to simultaneously improve miniaturization and heat dissipation of the semiconductor device.

SUMMARY

One object of an aspect of the present disclosure is to provide a semiconductor device and a method for manufacturing the semiconductor device, which can simultaneously improve miniaturization and heat dissipation of the semiconductor device.

According to an aspect of the present disclosure, a semiconductor device includes a substrate having a base provided with a first surface and a second surface opposite to the first surface, and a protrusion protruding from the base in a direction opposite to the first surface; a semiconductor layer in contact with the first surface; a first metal layer provided on the semiconductor layer in contact with the semiconductor layer, and overlapping the protrusion in a plan view perpendicular to the first surface; a diamond layer having a third surface in contact with the second surface, and a fourth surface opposite to the third surface; and a second metal layer covering an inner side of a through hole and the fourth surface and electrically connected to the first metal layer, wherein the through hole penetrates the protrusion, the base, and the semiconductor layer and reaches the first metal layer.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DETAILED DESCRIPTION

Figure 1:
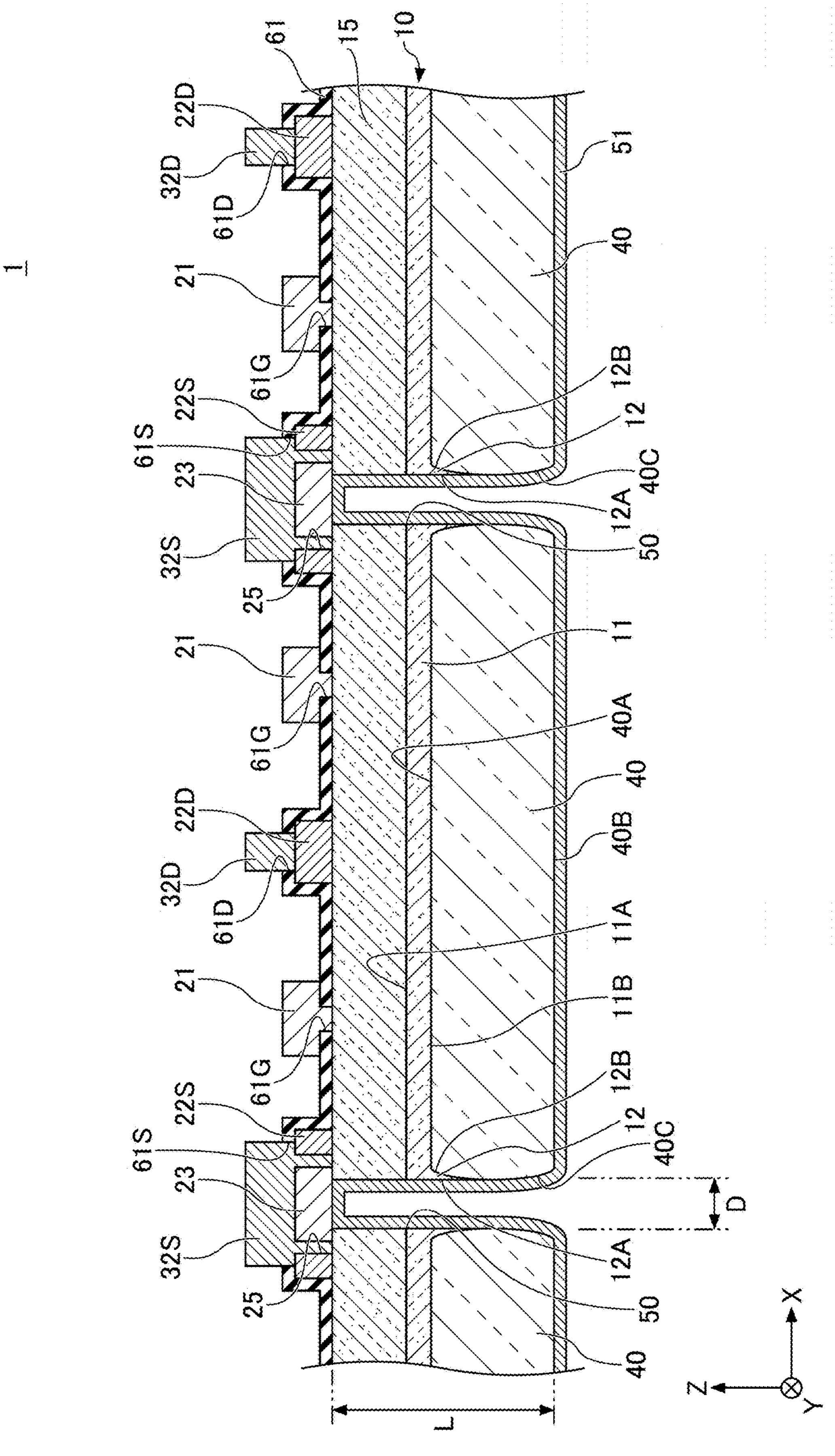
FIG. 1 is a cross sectional view illustrating a semiconductor device according to a first embodiment.

First, embodiments of the present disclosure will be described with reference to the drawings.

[1] According to an aspect of the present disclosure, a semiconductor device includes a substrate having a base provided with a first surface and a second surface opposite to the first surface, and a protrusion protruding from the base in a direction opposite to the first surface; a semiconductor layer in contact with the first surface; a first metal layer provided on the semiconductor layer in contact with the semiconductor layer, and overlapping the protrusion in a plan view perpendicular to the first surface; a diamond layer having a third surface in contact with the second surface, and a fourth surface opposite to the third surface; and a second metal layer covering an inner side of a through hole and the fourth surface and electrically connected to the first metal layer, wherein the through hole penetrates the protrusion, the base, and the semiconductor layer and reaches the first metal layer.

Because the third surface of the diamond layer is in contact with the second surface of the base, heat generated in the semiconductor layer can easily be transferred to the diamond layer. In addition, the through hole is formed in the protrusion, the base, and the semiconductor layer, and it is unnecessary to process the diamond layer in order to form the through hole. For this reason, a micro through hole can easily be formed. Accordingly, it is possible to simultaneously improve the miniaturization and heat dissipation of the semiconductor device.

[2] In the semiconductor device according to [1], the diamond layer may have a fifth surface continuous with an inner wall surface of the through hole, and the second metal layer may cover the fifth surface. In this case, the through hole can be formed, using the diamond layer as a mask. Accordingly, a mask for forming the through hole is not required, and the number of processes or steps can be reduced when compared with a case where the mask is used to form the through hole.

[3] In the semiconductor device according to [2], the protrusion may have a sixth surface continuous with the fourth surface, and the second metal layer may cover the sixth surface. In this case, a large contact area can easily be secured between the second metal layer and the protrusion, and a favorable adhesion can easily be obtained.

[4] In the semiconductor device according to any one of [1] to [3], a distance between an interface between the semiconductor layer and the first metal layer, and the fourth layer is greater than or equal to four times a maximum diameter of the through hole. In this case, a through hole having a small diameter can be obtained, which is suitable for the miniaturization of the semiconductor device.

[5] In the semiconductor device according to any one of [1] to [4], the substrate may be a silicon carbide substrate or a silicon substrate. In this case, it is particularly easy to form the through hole.

[6] According to another aspect of the present disclosure, a method for manufacturing a semiconductor device includes forming a semiconductor layer on a first surface of a substrate having a seventh surface opposite to the first surface; forming a recess in the seventh surface so as to form, on the substrate, a base having the first surface and a second surface opposite to the first surface, and a protrusion protruding from the base in a direction opposite to the first surface; forming a diamond layer having a third surface in contact with the second surface, and a fourth surface opposite to the third surface; forming, on the semiconductor layer, a first metal layer overlapping the protrusion in a plan view perpendicular to the first surface; forming a through hole penetrating the protrusion, the base, and the semiconductor layer and reaching the first metal layer; and forming, on an inner side of the through hole, a second metal layer electrically connected to the first metal layer and covering the fourth surface.

The through hole can be formed in the protrusion, the base, and the semiconductor layer, without processing the diamond layer, and the second metal layer can be formed on the inner side the through hole. For this reason, a micro through hole can easily be formed. In addition, because the third surface of the diamond layer is in contact with the second surface of the base, heat generated in the semiconductor layer can easily be transferred to the diamond layer. Accordingly, it is possible to simultaneously improve the miniaturization and heat dissipation of the semiconductor device.

[7] In the method for manufacturing the semiconductor device according to [6], the forming the through hole may include etching the protrusion in a state where an entirety of an end surface of the protrusion is exposed. In this case, a mask for forming the through hole is not required, and the number of processes or steps can be reduced when compared to a case where the protrusion is etched using a mask.

[8] In the method for manufacturing the semiconductor device according to [6], the forming the through hole may include forming a mask covering a portion of the end surface of the protrusion, and etching a portion of the protrusion exposed through the mask. In this case, the through hole can be formed with a high accuracy, using the mask.

[9] In the method for manufacturing the semiconductor device according to any one of [6] to [8], the forming the diamond layer may include depositing a first diamond layer on an inner side of the recess and an end surface of the protrusion, and polishing the first diamond layer and the protrusion. In this case, it is easy to control an amount of diamond that is deposited.

Hereinafter, embodiments of the present disclosure will be described in detail, but the present disclosure is not limited thereto. In the present specification and the drawings, constituent elements having substantially the same functional configuration are designated by the same reference numerals, and a redundant description thereof may be omitted. In the following description, an XYZ orthogonal coordinate system is used. However, the coordinate system is merely defined for the description, and is not intended to limit the orientation of the semiconductor device. Further, when viewed from an arbitrary point, a +Z-side may be referred to as above, upper side, or top, and a −Z-side may be referred to as a below, lower side, or a bottom.

First Embodiment

A first embodiment will be described. The first embodiment relates to a semiconductor device including a GaN (or GaN-based) high electron mobility transistor (HEMT).

[Configuration of Semiconductor Device]

Figure 2:
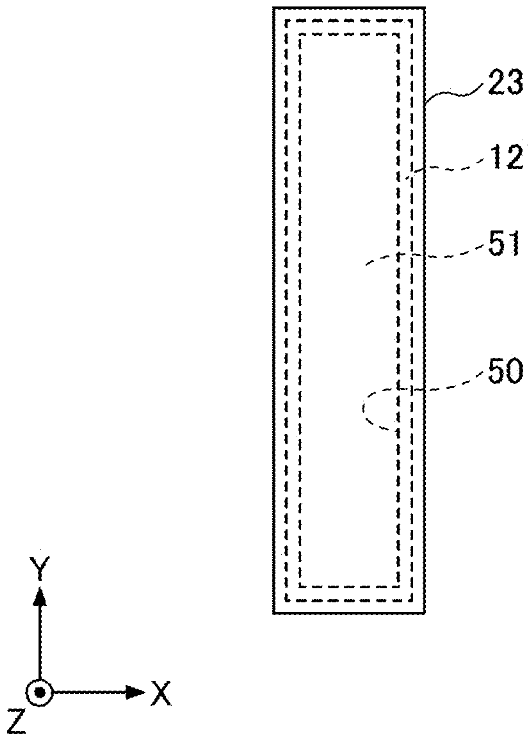
FIG. 2 is a plan view illustrating the semiconductor device according to the first embodiment.

A configuration of the semiconductor device according to the first embodiment will be described. FIG. 1 is a cross sectional view illustrating the semiconductor device according to the first embodiment. FIG. 2 is a plan view illustrating the semiconductor device according to the first embodiment.

As illustrated in FIG. 1, a semiconductor device 1 according to the first embodiment mainly includes a substrate 10, a semiconductor layer 15, a plurality of gate electrodes 21, a plurality of source electrodes 22S, a plurality of drain electrodes 22D, an etching stopper 23, a plurality of source interconnects 32S, a plurality of drain interconnects 32D, back electrodes 51, and a plurality of diamond layers 40.

The substrate 10 is a silicon carbide (SiC) substrate, for example. The substrate 10 includes a base 11, and a plurality of protrusions 12. The base 11 has a first surface 11A, and a second surface 11B opposite to the first surface 11A. The second surface 11B is located below (on the −Z-side of) the first surface 11A. The first surface 11A is an upper surface, and the second surface 11B is a lower surface. The protrusion 12 protrudes from the base 11 and extends in a direction opposite to the first surface 11A.

The semiconductor layer 15 is in contact with the first surface 11A of the base 11. The semiconductor layer 15 is provided on the base 11. The semiconductor layer 15 is a nitride semiconductor layer including gallium (Ga), for example. The nitride semiconductor layer forms a portion of the high electron mobility transistor, such as an electron transit layer (channel layer) and an electron supply layer (barrier layer).

The source electrodes 22S and the drain electrodes 22D are provided on the semiconductor layer 15. The source electrodes 22S and the drain electrodes 22D extend in a direction parallel to a Y-axis direction. The source electrodes 22S and the drain electrodes 22D are alternately arranged in an X-axis direction. The source electrodes 22S overlap the protrusions 12 in a plan view perpendicular to the first surface 11A. The source electrodes 22S and the drain electrodes 22D are aluminum (Al) electrodes, for example. The Al electrodes make an ohmic contact with the semiconductor layer 15.

An opening 25 is formed in the source electrode 22S. The semiconductor layer 15 is exposed through the opening 25. The etching stopper 23 is formed inside the opening 25 in the plan view perpendicular to the first surface 11A. The etching stopper 23 is provided on the semiconductor layer 15, and is in contact with the semiconductor layer 15. The etching stopper 23 includes a nickel (Ni) layer and a gold (Au) layer that are laminated in this order in an upward direction. As illustrated in FIG. 2, the protrusion 12 overlaps the etching stopper 23 in the plan view perpendicular to the first surface 11A. FIG. 2 illustrates only the etching stopper 23, the protrusion 12, a through hole 50 which will be described later, and the back electrode 51. The etching stopper 23 is an example of a first metal layer. The protrusion 12 may be included on an inner side the etching stopper 23 in the plan view perpendicular to the first surface 11A.

In the semiconductor device 1, the through hole 50 is formed in the protrusion 12, the base 11, and the semiconductor layer 15. The through hole 50 penetrates the protrusion 12, the base 11, and the semiconductor layer 15, and reaches the etching stopper 23. That is, the semiconductor device 1 has the through hole 50. In the plan view perpendicular to the first surface 11A, the through hole 50 is included on the inner side of the etching stopper 23.

The protrusion 12 has surfaces 12A and 12B in a cross sectional view parallel to the Z-axis direction. The surfaces 12A and 12B are connected to each other at ends thereof on the −Z-side thereof. The surface 12A corresponds to a portion of the inner wall surface of the through hole 50. The surface 12B is connected to the second surface 11B of the base 11. The surface 12B may be a curved surface. A distance between the surface 12A and the surface 12B is larger in portions closer to the base 11. At the ends on the −Z-side of the surfaces 12A and 12B, the distance between the surfaces 12A and 12B is zero.

The semiconductor device 1 includes an insulating film 61. The insulating film 61 covers an upper surface of the semiconductor layer 15. The insulating film 61 is a nitride film, such as a silicon nitride (SiN) film or the like, for example. A plurality of openings 61S, a plurality of openings 61D, and a plurality of openings 61G are formed in the insulating film 61. The openings 61S, the openings 61D, and the openings 61G extend in the direction parallel to the Y-axis direction. The openings 61S and the openings 61D are alternately arranged in the X-axis direction. A portion of the source electrode 22S is exposed through the opening 61S, and a portion of the drain electrode 22D is exposed through the opening 61D. The opening 61G is provided between the opening 61S and the opening 61D that are adjacent to each other in the X-axis direction. A portion of the semiconductor layer 15 is exposed through the opening 61G.

The gate electrode 21 extends in a direction parallel to the Y-axis direction. The gate electrode 21 covers the opening 61G of the insulating film 61, and makes a Schottky contact with the semiconductor layer 15 through the opening 61G. The gate electrode 21 is provided between the source electrode 22S and the drain electrode 22D that are adjacent to each other in the X-axis direction. The gate electrode 21 includes a Ni layer and a Au layer that are laminated in this order in the upward direction.

The source interconnect 32S is provided on the source electrode 22S and the etching stopper 23. The source interconnect 32S is in contact with the source electrode 22S and the etching stopper 23. The source electrode 22S and the etching stopper 23 are electrically connected to each other via the source interconnect 32S. The drain interconnect 32D is provided on the drain electrode 22D. The drain interconnect 32D is in contact with the drain electrode 22D. Each of the source interconnect 32S and the drain interconnect 32D includes a seed layer and a plating layer provided on the seed layer, for example. For example, the seed layer includes a titanium (Ti) layer, and the plating layer includes a Au layer. The plurality of source interconnects 32S may be connected to one another, and the plurality of drain interconnects 32D may be connected to one another.

The diamond layer 40 has a third surface 40A in contact with the second surface 11B, and a fourth surface 40B opposite to the third surface 40A. The fourth surface 40B is below (on the −Z-side of) the third surface 40A. The third surface 40A is an upper surface, and the fourth surface 40B is a lower surface. A thickness of the diamond layer 40, that is, a distance between the third surface 40A and the fourth surface 40B, is greater than a height of the protrusion 12 with reference to the base 11. In other words, the fourth surface 40B is separated more from the base 11 than the end surface of the protrusion 12 is from the base 11. The diamond layer 40 has a fifth surface 40C that is continuous with the inner wall surface of the through hole 50, that is, the surface 12A of the protrusion 12. The fifth surface 40C may be a curved surface.

The back electrode 51 is formed on a lower surface of the etching stopper 23, the inner wall surface of the through hole 50, and the fifth surface 40C and the fourth surface 40B of the diamond layer 40. The back electrode 51 is in contact with the etching stopper 23, and covers the fifth surface 40C, the fourth surface 40B, and the inner wall surface of the through hole 50. The back electrode 51 includes a seed layer and a plating layer, for example. For example, the seed layer includes a nickel-chromium (NiCr) layer and a Au layer provided below the NiCr layer, and the plating layer includes a Au plating layer. The NiCr layer may be provided below the Au plating layer. The back electrode 51 is an example of a second metal layer.

[Method for Manufacturing Semiconductor Device]

Next, a method for manufacturing the semiconductor device 1 according to the first embodiment will be described. FIG. 3 through FIG. 10 are cross sectional views illustrating the method for manufacturing the semiconductor device 1 according to the first embodiment.

Figure 3:
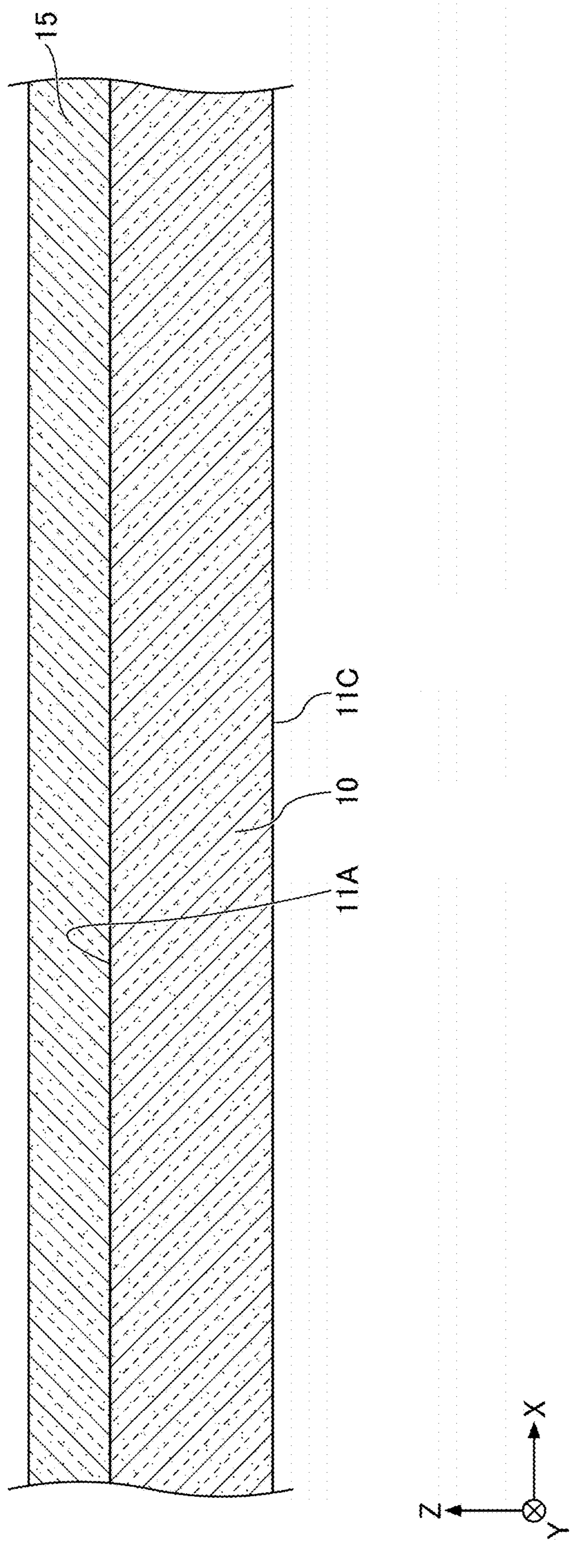
FIG. 3 is a cross sectional view (part 1) illustrating a method for manufacturing the semiconductor device according to the first embodiment.

First, as illustrated in FIG. 3, the semiconductor layer 15 is formed on the substrate 10 by metal organic chemical vapor deposition (MOCVD), for example. The substrate 10 has the first surface 11A, and a seventh surface 11C opposite to the first surface 11A. The seventh surface 11C is below (on the −Z-side of) the first surface 11A. The first surface 11A is the upper surface, and the seventh surface 11C is the lower surface. The semiconductor layer 15 is in contact with the first surface 11A.

Figure 4:
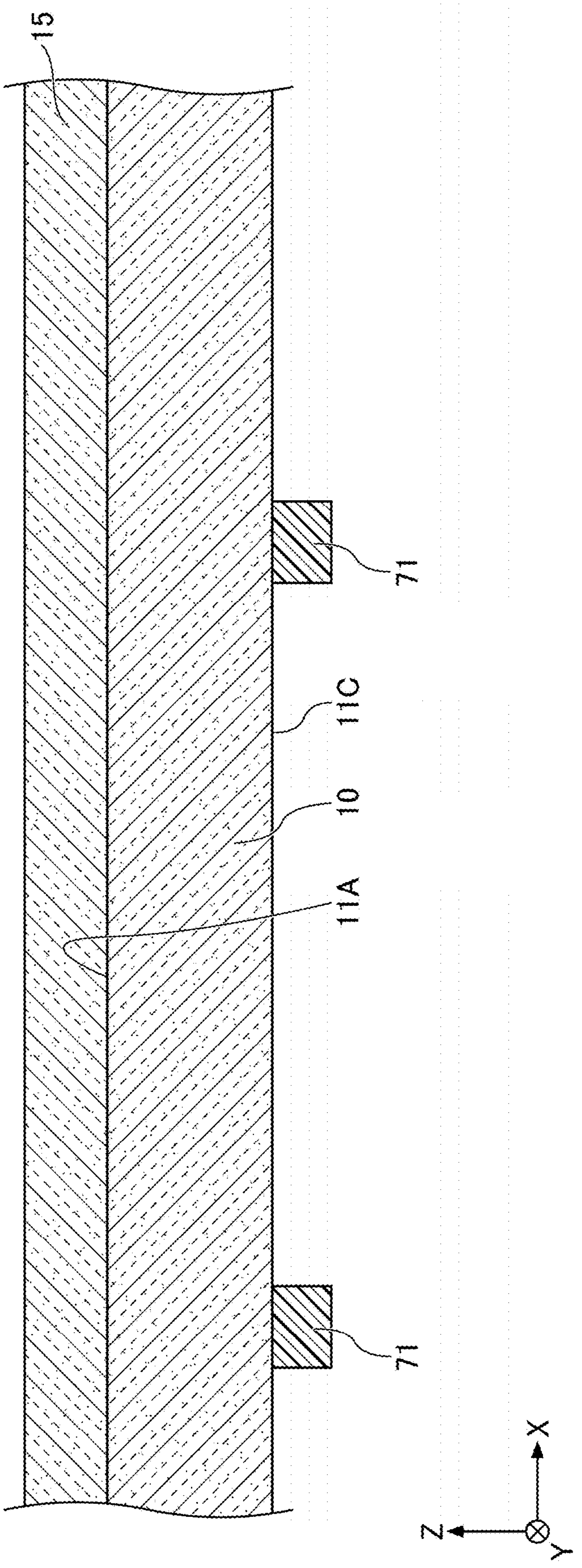
FIG. 4 is a cross sectional view (part 2) illustrating the method for manufacturing the semiconductor device according to the first embodiment.

Next, as illustrated in FIG. 4, a mask 71 is formed on the seventh surface 11C of the substrate 10. The mask 71 covers a portion of the substrate 10 where the protrusion 12 is to be formed in the plan view perpendicular to the first surface 11A.

Figure 5:
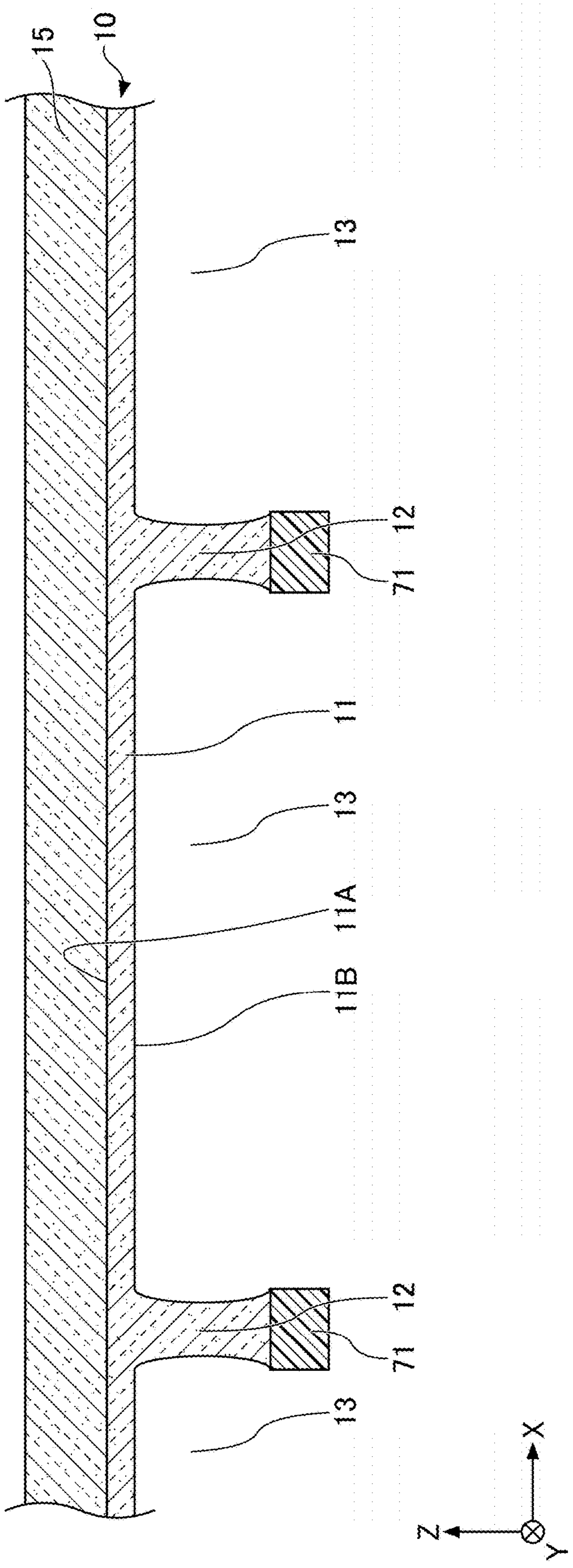
FIG. 5 is a cross sectional view (part 3) illustrating the method for manufacturing the semiconductor device according to the first embodiment.

Next, as illustrated in FIG. 5, the substrate 10 is etched from the seventh surface 11C, so as to form a recess 13. The recess 13 is formed in the substrate 10 by reactive ion etching (RIE), using a reactive gas including fluorine (F), for example. As a result, the base 11 and the protrusion 12 are formed on the substrate 10. The base 11 includes the first surface 11A and the second surface 11B opposite to the first surface 11A, and the protrusion 12 protrudes from the base 11 and extends in the direction opposite to the first surface 11A. In this state, an inner wall surface of the recess 13 becomes a concave surface, and the protrusion 12 includes a constricted portion.

Figure 6:
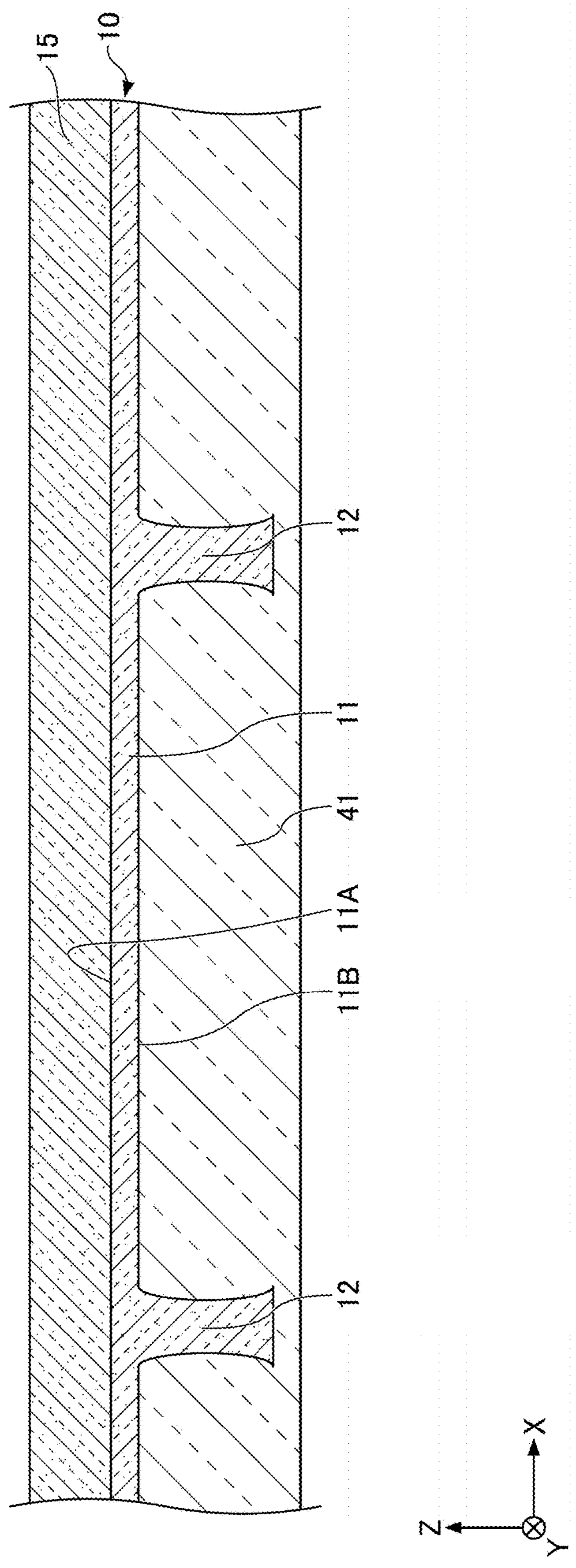
FIG. 6 is a cross sectional view (part 4) illustrating the method for manufacturing the semiconductor device according to the first embodiment.

Next, as illustrated in FIG. 6, the mask 71 is removed, and a diamond layer 41 is deposited inside the recess 13. The diamond layer 41 can be formed by CVD in a temperature environment greater than or equal to 700° C. and less than or equal to 1100° C., for example. Although the diamond layer 41 includes an amorphous or polycrystalline portion at an initial stage of growth, most of the diamond layer 41 becomes a single crystal. The diamond layer 41 may be formed so as to cover the end surface of the protrusion 12. The diamond layer 41 is an example of a first diamond layer.

Figure 7:
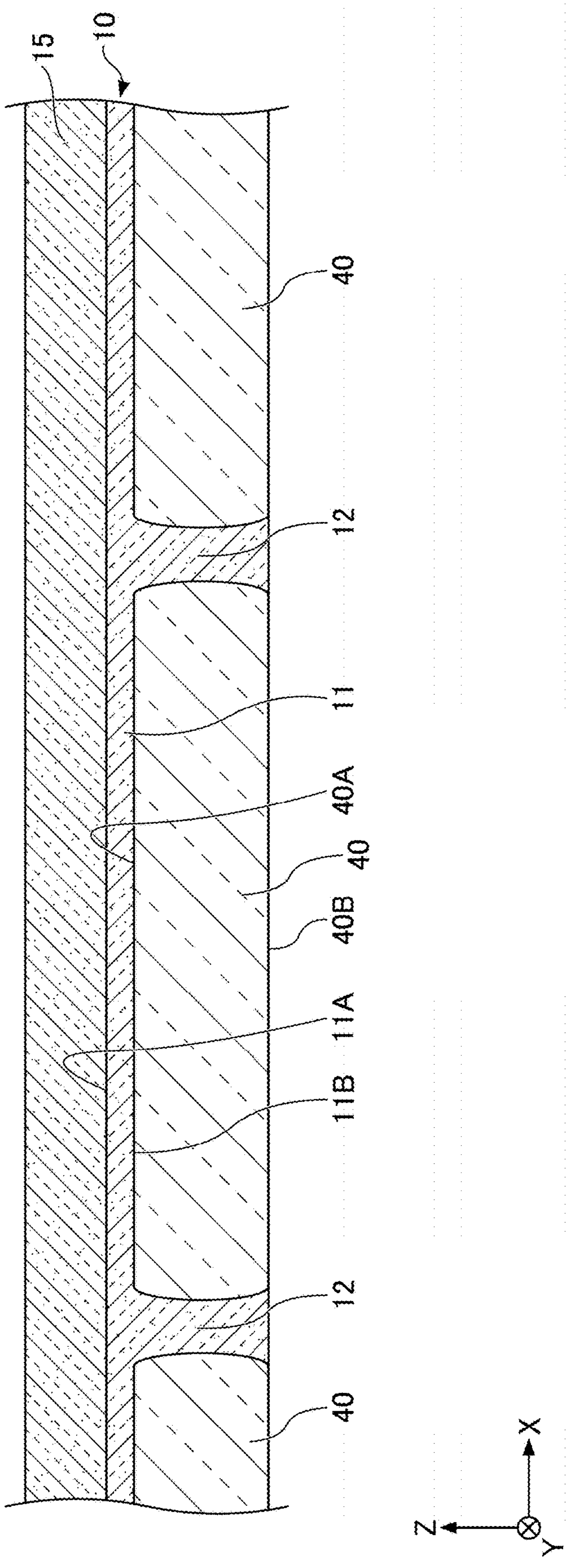
FIG. 7 is a cross sectional view (part 5) illustrating the method for manufacturing the semiconductor device according to the first embodiment.

Next, as illustrated in FIG. 7, the diamond layer 41 and the protrusion 12 are polished. As a result, the diamond layer 40 having the third surface 40A in contact with the second surface 11B, and the fourth surface 40B opposite to the third surface 40A, is formed from the diamond layer 41. A side surface of the diamond layer 40 becomes a convex surface along the inner wall surface of the recess 13.

Figure 8:
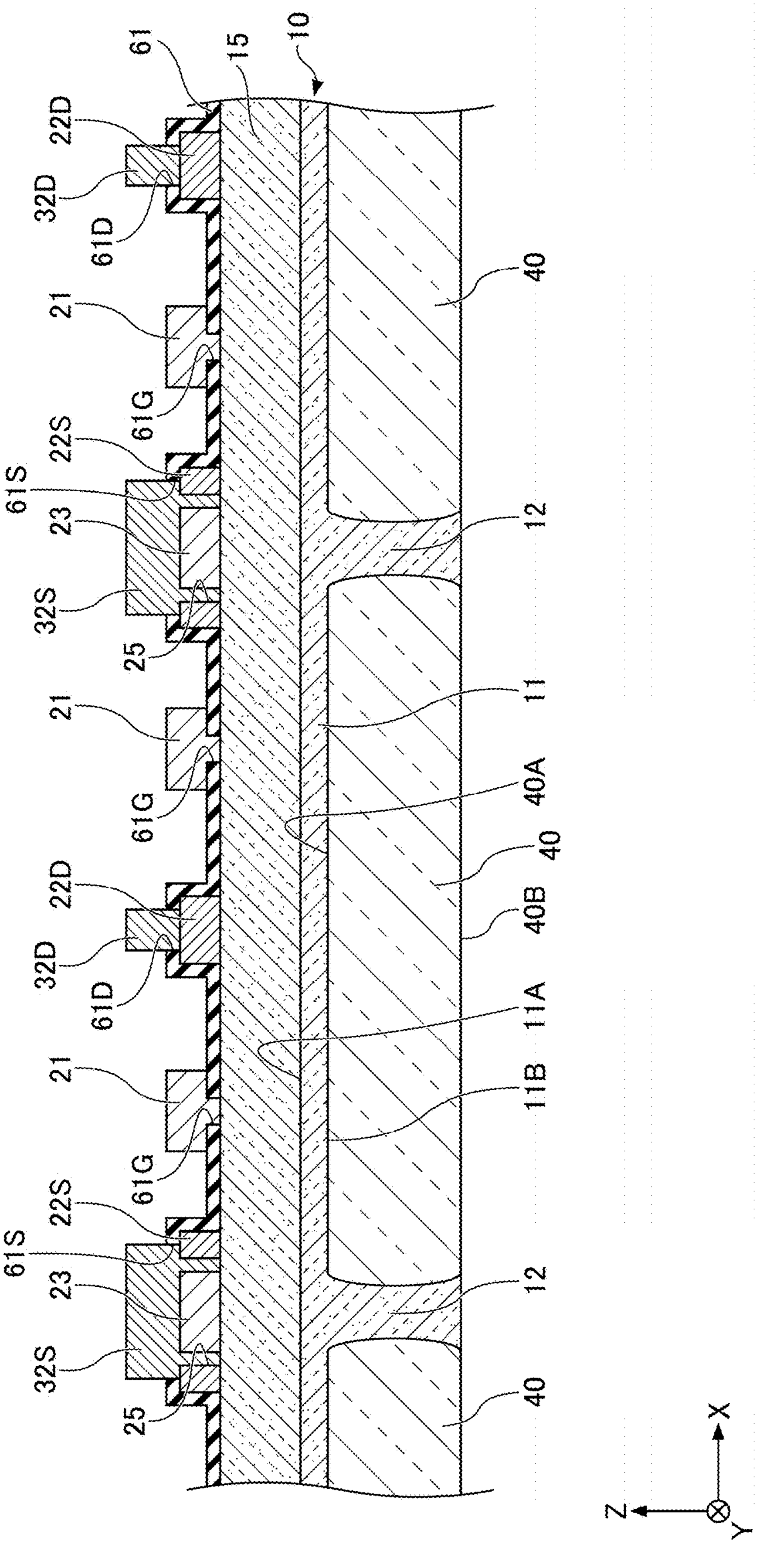
FIG. 8 is a cross sectional view (part 6) illustrating the method for manufacturing the semiconductor device according to the first embodiment.

Next, as illustrated in FIG. 8, the source electrodes 22S, the drain electrodes 22D, the insulating film 61, the openings 61S, the openings 61D, the openings 61G, the gate electrodes 21, the openings 25, the etching stopper 23, the source interconnects 32S, and the drain interconnects 32D are formed. In this state, the etching stopper 23 is formed on the semiconductor layer 15, so as to overlap the protrusion 12 in the plan view perpendicular to the first surface 11A. The protrusion 12 may be included on the inner side the etching stopper 23 in the plan view perpendicular to the first surface 11A.

Figure 9:
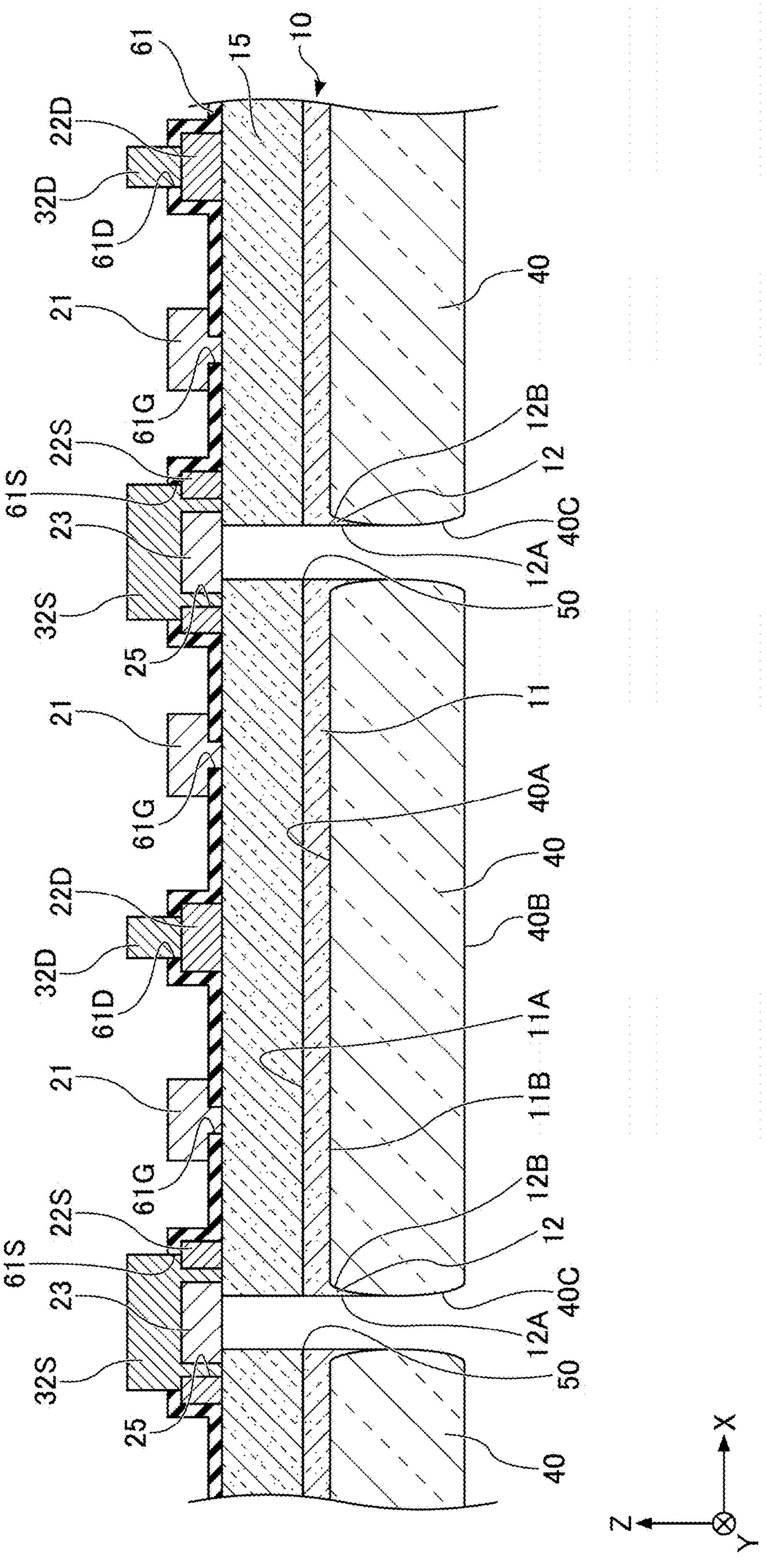
FIG. 9 is a cross sectional view (part 7) illustrating the method for manufacturing the semiconductor device according to the first embodiment.

Next, as illustrated in FIG. 9, the through hole 50 is formed in the protrusion 12, the base 11, and the semiconductor layer 15. The through hole 50 penetrates the protrusion 12, the base 11, and the semiconductor layer 15, and reaches the etching stopper 23. The protrusion 12 is etched in a state where the entire end surface of the protrusion 12 is exposed. When forming the through hole 50, the protrusion 12, the base 11, and the semiconductor layer 15 are etched by RIE, using a reactive gas including F, for example. In this state, the entire protrusion 12 is removed below the constricted portion of the protrusion 12. The protrusion 12, the base 11, and the semiconductor layer 15 above the constricted portion of the protrusion 12 are successively etched by anisotropic etching, using the diamond layer 40 as a mask. As a result, a portion of the protrusion 12 remains, and the remaining portion of the protrusion 12 forms the surface 12A and the surface 12B. The surface 12B is a portion of the inner wall surface of the recess 13 (refer to FIG. 5). In addition, the diamond layer 40 has the fifth surface 40C that is continuous with the inner wall surface of the through hole 50. The fifth surface 40C is continuous with the inner wall surface of the through hole 50, and for example, the inner wall surface of the through hole 50 and the fifth surface 40C form a single continuous curved surface. A portion of such a continuous curved surface corresponds to the internal wall surface of the through hole 50, and another portion of the continuous curved surface corresponds to the fifth surface 40C.

Figure 10:
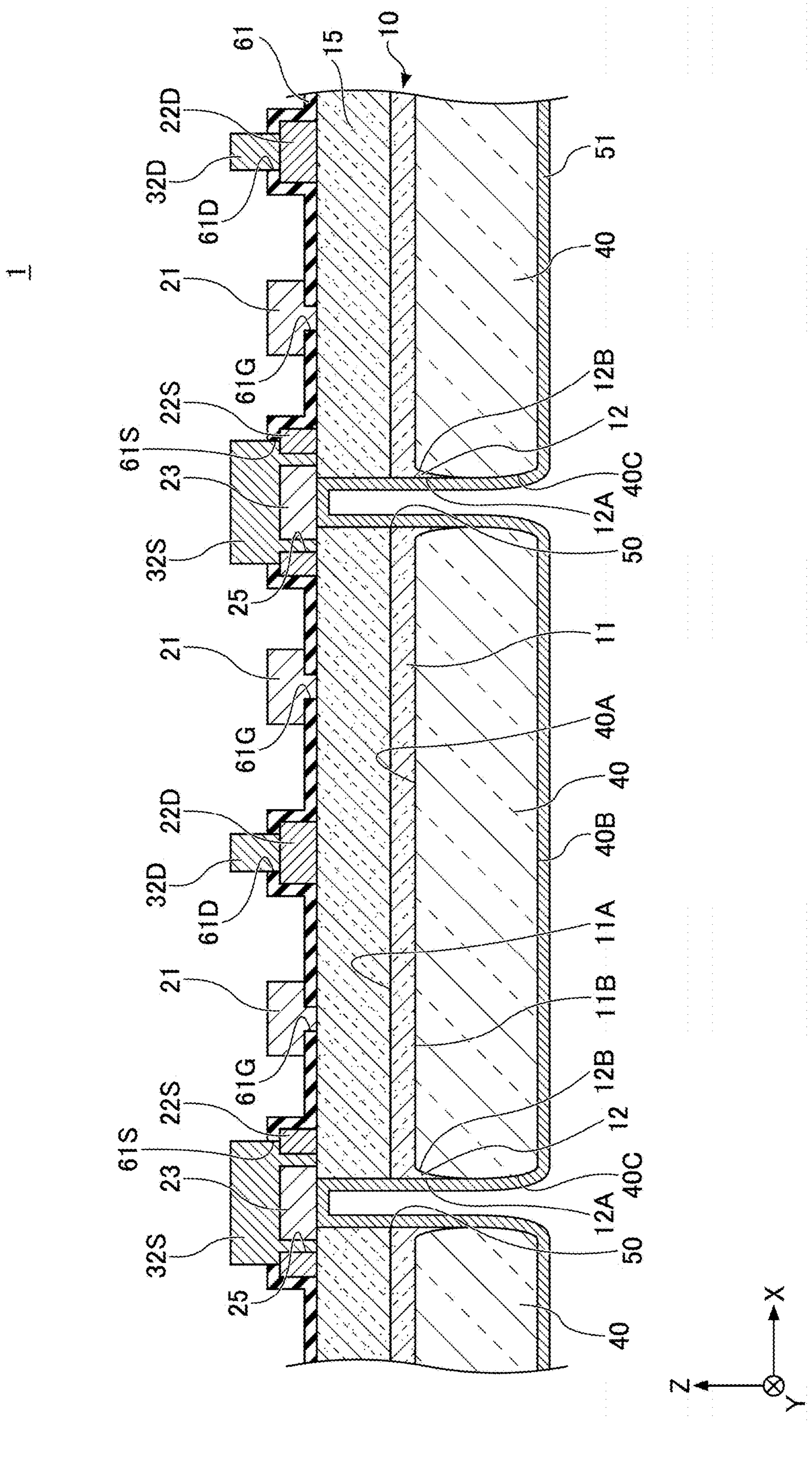
FIG. 10 is a cross sectional view (part 8) illustrating the method for manufacturing the semiconductor device according to the first embodiment.

Next, as illustrated in FIG. 10, the back electrode 51 is formed. The back electrode 51 is formed on the lower surface of the etching stopper 23, the inner wall surface of the through hole 50, and the fifth surface 40C and the fourth surface 40B of the diamond layer 40. When forming the back electrode 51, the seed layer is formed, and the plating layer is thereafter formed on the seed layer, for example. When forming the seed layer, the NiCr layer is formed by sputtering, and the Au layer is thereafter formed, for example. The plating layer may be a Au plating layer, for example. The NiCr layer may be formed by sputtering after forming the plating layer.

The semiconductor device 1 according to the first embodiment can be manufactured in the manner described above.

In the semiconductor device 1 according to the first embodiment, because the third surface 40A of the diamond layer 40 is in contact with the second surface 11B of the base 11, the heat generated in the semiconductor layer 15 can easily be transferred to the diamond layer 40. Further, the through hole 50 can be formed in the protrusion 12, the base 11, and the semiconductor layer 15, without processing the diamond layer 40, and the back electrode 51 can be formed on the inner side of the through hole 50. For this reason, a micro through hole can easily be formed as the through hole 50. Accordingly, it is possible to simultaneously improve the miniaturization and heat dissipation of the semiconductor device.

In particular, because the protrusion 12 is etched in a state where the entire end surface of the protrusion 12 is exposed when forming the through hole 50, a mask for forming the through hole 50 is not required, and the number of processes or steps can be reduced compared to the case where the protrusion 12 is etched using the mask. As a result of such an etching, the diamond layer 40 has the fifth surface 40C continuous with to the inner wall surface of the through hole 50, and the back electrode 51 covers the fifth surface 40C.

Second Embodiment

Next, a second embodiment will be described. The second embodiment differs from the first embodiment mainly in the configuration of the substrate 10.

[Configuration of Semiconductor Device]

Figure 11:
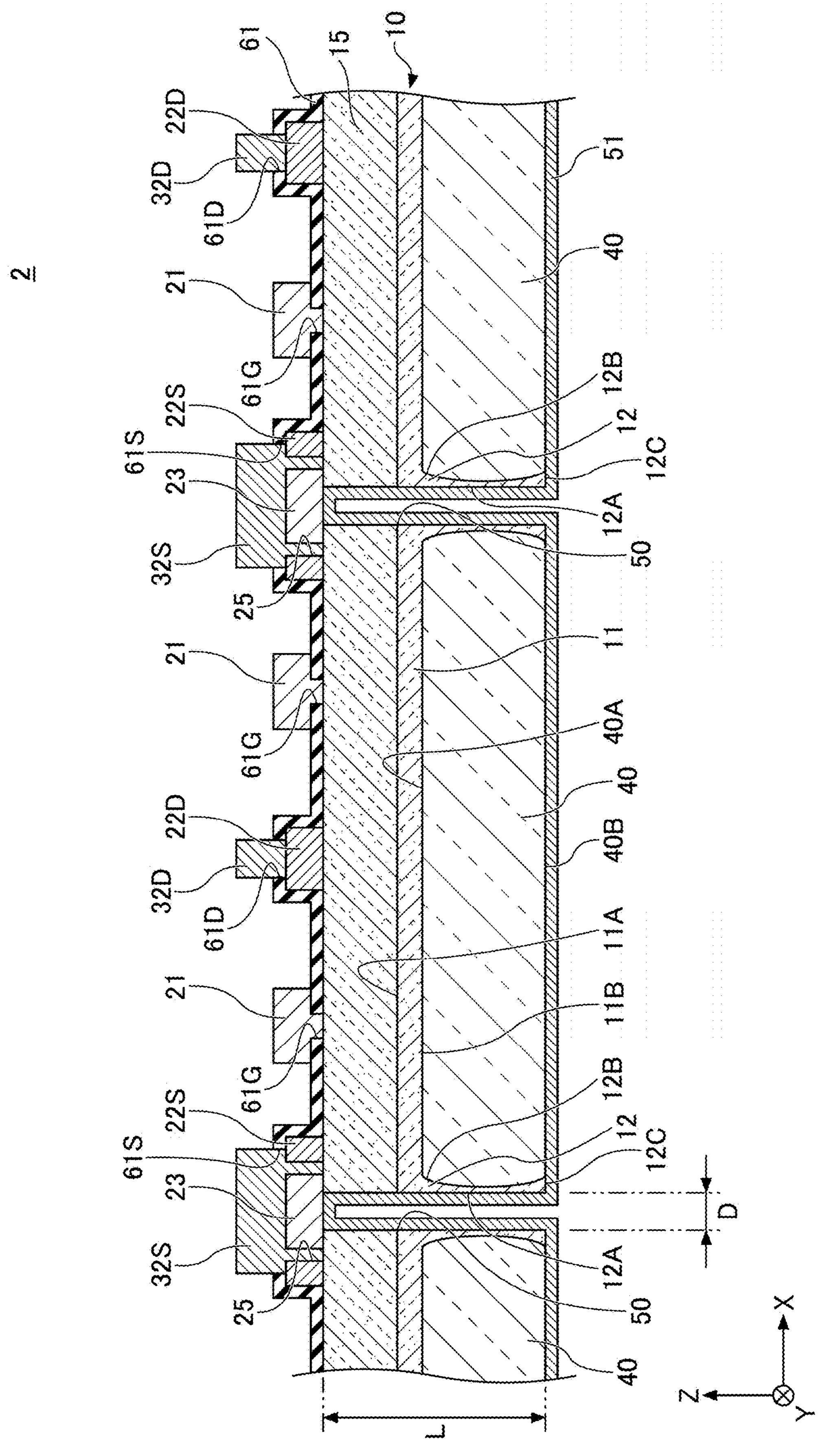
FIG. 11 is a cross sectional view illustrating the semiconductor device according to a second embodiment.

The configuration of the semiconductor device according to the second embodiment will be described. FIG. 11 is a cross sectional view illustrating the semiconductor device according to the second embodiment.

As illustrated in FIG. 11, in a semiconductor device 2 according to the second embodiment, a diameter of the through hole 50 is smaller than that of the first embodiment, and the entire side surface of the diamond layer 40 is in contact with the protrusion 12. Unlike the first embodiment, the diamond layer 40 does not have the fifth surface 40C that is continuous with the inner wall surface of the through hole 50. The protrusion 12 has a sixth surface 12C that is continuous with the fourth surface 40B of the diamond layer 40. The sixth surface 12C coincides with the fourth surface 40B, for example. The height of the protrusion 12 with respect to the base 11 is equal to the thickness of the diamond layer 40. The back electrode 51 covers the sixth surface 12C of the protrusion 12.

Otherwise, the configuration of the second embodiment is the same as that of the first embodiment.

[Method for Manufacturing Semiconductor Device]

Figure 12:
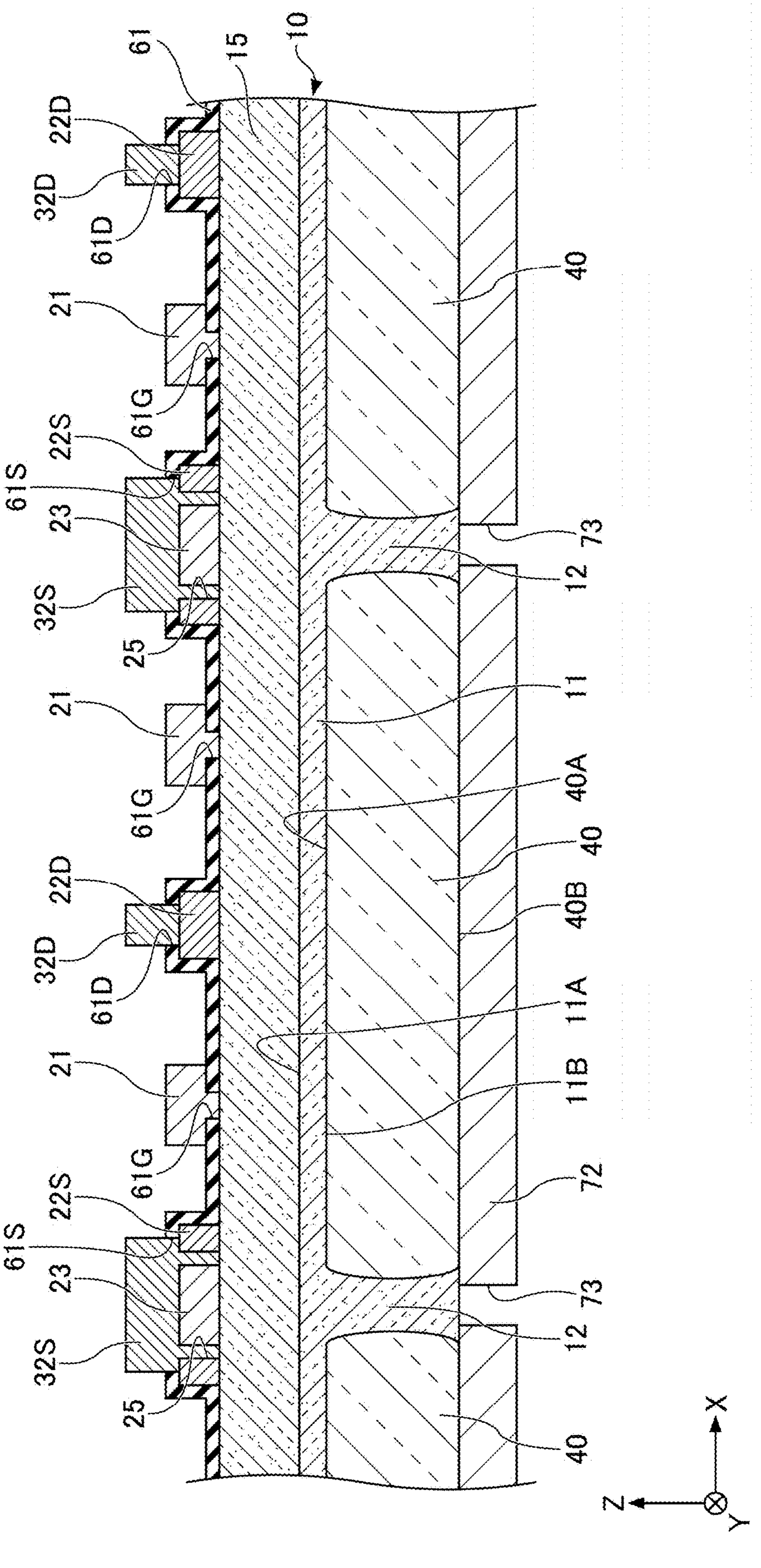
FIG. 12 is a cross sectional view (part 1) illustrating the method for manufacturing the semiconductor device according to the second embodiment.
Figure 13:
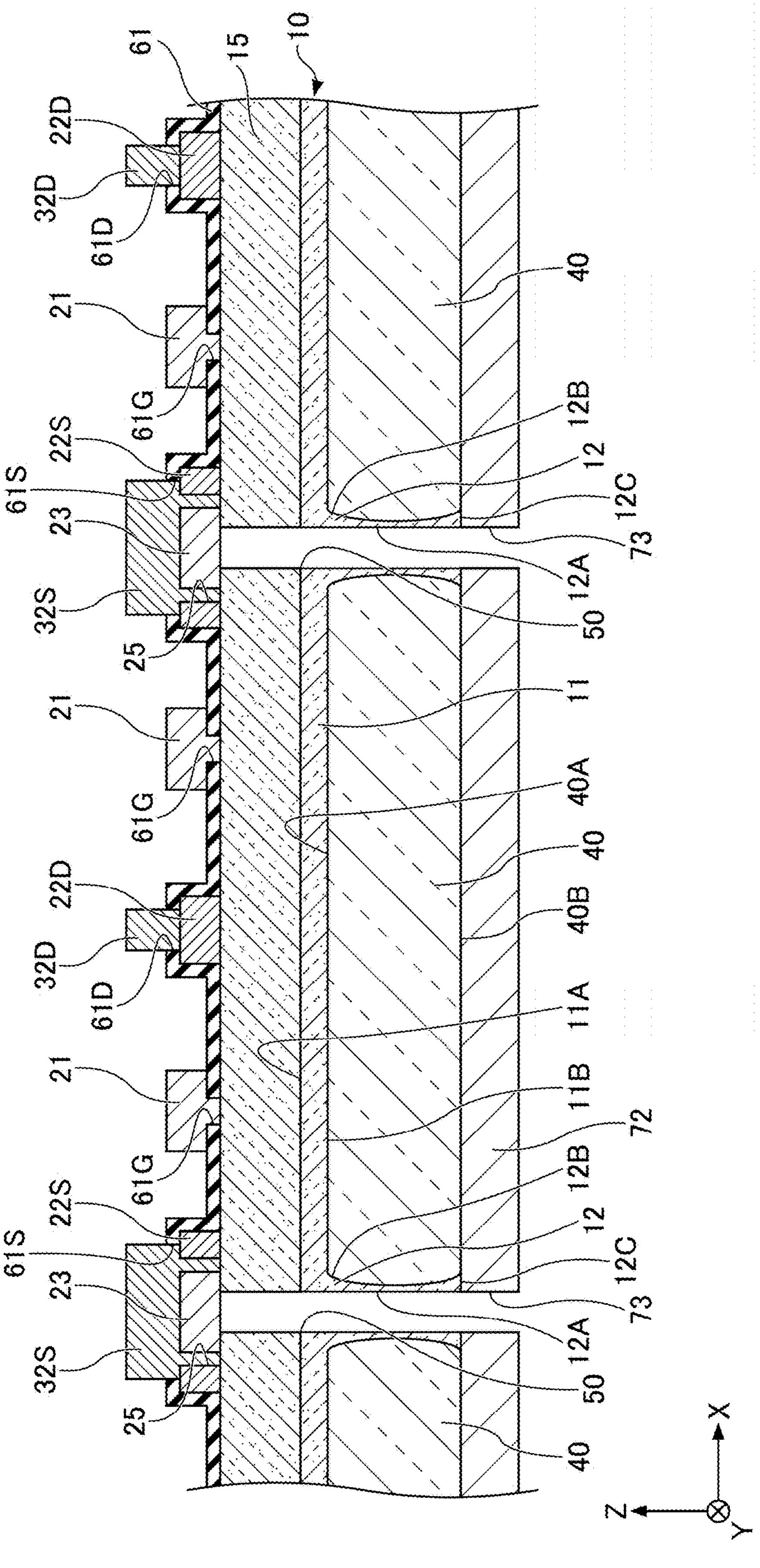
FIG. 13 is a cross sectional view (part 2) illustrating the method for manufacturing the semiconductor device according to the second embodiment.
Figure 14:
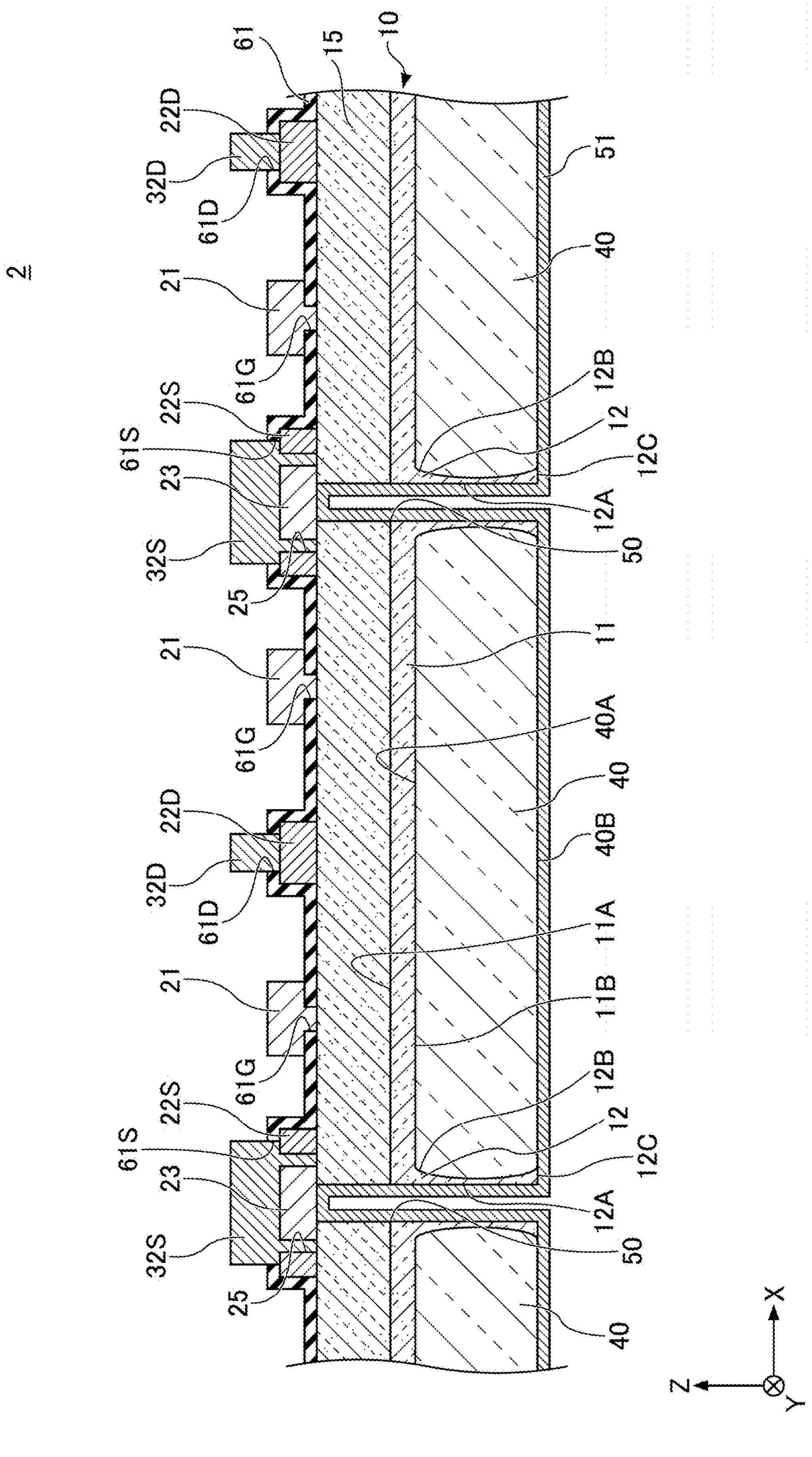
FIG. 14 is a cross sectional view (part 3) illustrating the method for manufacturing the semiconductor device according to the second embodiment.

Next, a method for manufacturing the semiconductor device 2 according to the second embodiment will be described. FIG. 12 through FIG. 14 are cross sectional views illustrating the method for manufacturing the semiconductor device 2 according to the second embodiment.

First, similar to the first embodiment, the processes or steps up to the formation of the source electrodes 22S, the drain electrodes 22D, the insulating film 61, the openings 61S, the openings 61D, the openings 61G, the gate electrodes 21, the openings 25, the etching stopper 23, the source interconnects 32S, and the drain interconnects 32D are performed (refer to FIG. 8). Next, as illustrated in FIG. 12, a mask 72 is formed on the lower surface of the substrate 10 and the lower surface (fourth surface 40B) of the diamond layer 40. The mask 72 has an opening 73 in a portion where the through hole 50 of the substrate 10 is to be formed. The mask 72 includes a NiCr layer in contact with the substrate 10, and a Au layer provided on the NiCr layer, for example. Dry etching is performed when forming the opening in the Au layer, and wet etching is performed when forming the opening in the NiCr layer.

Next, as illustrated in FIG. 13, the through hole 50 is formed in the protrusion 12, the base 11, and the semiconductor layer 15. The through hole 50 penetrates the protrusion 12, the base 11, and the semiconductor layer 15, and reaches the etching stopper 23. When forming the through hole 50, the protrusion 12, the base 11, and the semiconductor layer 15 are etched by RIE, using a reactive gas including F, for example. In this state, portions of the protrusion 12, the base 11, and the semiconductor layer 15 exposed through the opening 73 are successively etched by anisotropic etching. As a result, a portion of the protrusion 12 remains. The remaining portion of the protrusion 12 forms the surface 12A, the surface 12B, and the sixth surface 12C. The sixth surface 12C is continuous with the fourth surface 40B of the diamond layer 40.

Next, as illustrated in FIG. 14, the mask 72 is removed, and the back electrode 51 is formed. The back electrode 51 is formed on the lower surface of the etching stopper 23, the inner wall surface of the through hole 50, the sixth surface 12C of the protrusion 12, and the fourth surface 40B of the diamond layer 40.

The semiconductor device 2 according to the second embodiment can be manufactured in the manner described above.

In the semiconductor device 2 according to the second embodiment, because the third surface 40A of the diamond layer 40 is in contact with the second surface 11B of the base 11, the heat generated in the semiconductor layer 15 can easily be transferred to the diamond layer 40. Further, the through hole 50 can be formed in the protrusion 12, the base 11, and the semiconductor layer 15, without processing the diamond layer 40, and the back electrode 51 can be formed on the inner side of the through hole 50. For this reason, a micro through hole can easily be formed as the through hole 50. Accordingly, it is possible to simultaneously improve the miniaturization and heat dissipation of the semiconductor device.

In particular, when forming the through hole 50, the mask 72 covering a portion of the end surface of the protrusion 12 is formed, and the portion of the protrusion 12 exposed through the mask 72 is etched. Thus, the through hole 50 can be formed with a high accuracy. As a result of such an etching, the protrusion 12 has the sixth surface 12C continuous with the fourth surface 40B, and the back electrode 51 covers the sixth surface 12C. In this case, a large contact area can easily be secured between the back electrode 51 and the protrusion 12, and a favorable adhesion can easily be obtained.

In both the first embodiment and the second embodiment, a distance (or length) L between the interface between the semiconductor layer 15 and the etching stopper 23, and the fourth surface 40B, from a viewpoint of suitably miniaturizing the semiconductor device, is preferably greater than or equal to four times a maximum diameter D of the through hole 50. The distance L may be greater than or equal to 4.5 times the maximum diameter D, or may be greater than or equal to 5 times the maximum diameter D.

The substrate 10 is not limited to a silicon carbide substrate, and may be a silicon substrate. In either case where the substrate 10 is the silicon carbide substrate or the silicon substrate, the through hole 50 can easily be formed compared to diamond. In particular, the silicon substrate is easy to process. In addition, by using the silicon carbide substrate, a high breakdown voltage can easily be obtained.

In addition, during the manufacturing process, the diamond layer 41 is deposited on the inner side of the recess 13 and the end surface of the protrusion 12, and the diamond layer 41 and the protrusion 12 are thereafter polished. Thus, it is possible to easily control an amount of the diamond layer 41 that is deposited.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

According to the present disclosure, it is possible to simultaneously improve the miniaturization and heat dissipation of the semiconductor device.

What is claimed is:

1. A semiconductor device comprising:
- a substrate having a base provided with a first surface and a second surface opposite to the first surface, and a protrusion protruding from the base in a direction opposite to the first surface;
- a semiconductor layer in contact with the first surface;
- a first metal layer provided on the semiconductor layer in contact with the semiconductor layer, and overlapping the protrusion in a plan view perpendicular to the first surface;
- a diamond layer having a third surface in contact with the second surface, and a fourth surface opposite to the third surface; and
- a second metal layer covering an inner side of a through hole and the fourth surface and electrically connected to the first metal layer,
- wherein the through hole penetrates the protrusion, the base, and the semiconductor layer and reaches the first metal layer.

2. The semiconductor device as claimed in claim 1, wherein:

the diamond layer has a fifth surface continuous with an inner wall surface of the through hole, and the second metal layer covers the fifth surface.

3. The semiconductor device as claimed in claim 1, wherein:

the protrusion has a sixth surface continuous with the fourth surface, and the second metal layer covers the sixth surface.

4. The semiconductor device as claimed in claim 1, wherein a distance between an interface between the semiconductor layer and the first metal layer, and the fourth layer is greater than or equal to four times a maximum diameter of the through hole.

5. The semiconductor device as claimed in claim 1, wherein the substrate is a silicon carbide substrate or a silicon substrate.

6. A method for manufacturing a semiconductor device, comprising:

forming a semiconductor layer on a first surface of a substrate having a seventh surface opposite to the first surface;

forming a recess in the seventh surface so as to form, on the substrate, a base having the first surface and a second surface opposite to the first surface, and a protrusion protruding from the base in a direction opposite to the first surface;

forming a diamond layer having a third surface in contact with the second surface, and a fourth surface opposite to the third surface;

forming, on the semiconductor layer, a first metal layer overlapping the protrusion in a plan view perpendicular to the first surface;

forming a through hole penetrating the protrusion, the base, and the semiconductor layer and reaching the first metal layer; and forming, on an inner side of the through hole, a second metal layer electrically connected to the first metal layer and covering the fourth surface.

7. The method for manufacturing the semiconductor device as claimed in claim 6, wherein the forming the through hole includes etching the protrusion in a state where an entirety of an end surface of the protrusion is exposed.

8. The method for manufacturing the semiconductor device as claimed in claim 6, wherein the forming the through hole includes:

forming a mask covering a portion of the end surface of the protrusion; and etching a portion of the protrusion exposed through the mask.

9. The method for manufacturing the semiconductor device as claimed in claim 6, wherein the forming the diamond layer includes:

depositing a first diamond layer on an inner side of the recess and an end surface of the protrusion; and polishing the first diamond layer and the protrusion.

* * * * *